(12) United States Patent
Lau et al.

(10) Patent No.: US 7,893,771 B2
(45) Date of Patent: Feb. 22, 2011

(54) WIDEBAND LINEARIZATION AND ADAPTIVE POWER MANAGEMENT FOR MICROWAVE POWER AMPLIFIERS

(75) Inventors: Kwok Wai Lau, Kowloon (HK); Quan Xue, Kowloon (HK)

(73) Assignee: City University of Hong Kong, Kowloon (HK)

( * ) Notice: Subject to any disclaimer, the term of this patent is extended or adjusted under 35 U.S.C. 154(b) by 322 days.

(21) Appl. No.: 11/620,290

(22) Filed: Jan. 5, 2007

(65) Prior Publication Data

US 2008/0164949 A1 Jul. 10, 2008

(51) Int. Cl.
*H03F 3/04* (2006.01)
(52) U.S. Cl. ........................................ 330/296; 330/285
(58) Field of Classification Search ................ 330/296, 330/290
See application file for complete search history.

(56) References Cited

U.S. PATENT DOCUMENTS

| | | | | |
|---|---|---|---|---|
| 3,708,756 A | * | 1/1973 | Fajen | 330/296 |
| 3,984,783 A | * | 10/1976 | Bickley | 330/296 |
| 4,225,827 A | * | 9/1980 | Davis, Jr. | 330/296 |
| 5,625,323 A | * | 4/1997 | Tozawa | 330/277 |
| 6,427,067 B1 | * | 7/2002 | Arentz | 455/232.1 |
| 2006/0114066 A1 | | 6/2006 | Oka | 330/302 |

OTHER PUBLICATIONS

Ka Tsun Mok, et al., "Broadband Characteristics of a Parallel Diode Linearized Amplifier," Microwave and Optical Technology Letters, vol. 36, No. 2, Jan. 20, 2003, pp. 82-83.
Kazuhisa Yamauchi, et al., "A Microwave Miniaturized Linearizer Using a Parallel Diode with a Bias Feed Resistance," IEEE Transactions on Microwave Theory and Techniques, vol. 45, No. 12, Dec. 1997, pp. 2431-2435.
Youn Sub Noh and Chul Soon Park, "PCS/W-CDMA Dual-Band MMIC Power Amplifier With a Newly Proposed Linearizing Bias Circuit," IEEE Journal of Solid-State Circuits, vol. 37, No. 9, Sep. 2002, pp. 1096-1099.
Wei Huang and Ricardo E. Saad, "Novel Third-Order Distortion Generator with Residual IM2 Suppression Capabilities," IEEE Transactions on Microwave Theory and Techniques, vol. 46, No. 12, Dec. 1998, pp. 2372-2382.

* cited by examiner

*Primary Examiner*—Robert Pascal
*Assistant Examiner*—Khiem D Nguyen
(74) *Attorney, Agent, or Firm*—Heslin Rothenberg Farley & Mesiti P.C.

(57) ABSTRACT

A power amplifier includes a bipolar transistor and a self-adaptive bias network situated between an RF input and the base of the bipolar transistor. The self-adaptive bias network suppresses the low frequency even-order intermodulation components. The self-adaptive bias network stabilizes a DC bias voltage to provide a substantially constant base-emitter voltage and provides an increased DC base current with increased input power when the power amplifier is operating within the nonlinear region.

8 Claims, 7 Drawing Sheets

WIDEBAND LINEARIZATION AND ADAPTIVE POWER MANAGEMENT FOR MICROWAVE POWER AMPLIFIERS

FIELD OF THE INVENTION

This invention relates to a novel microwave power amplifier topology, and to methods and circuits for providing wideband linearization and self-adaptive power management in a microwave bipolar power amplifier.

BACKGROUND TO THE INVENTION

Microwave power amplifiers are indispensable components in wireless communications systems and inherently nonlinear. High data rate wireless transmissions are commonly realized by bandwidth-efficient modulation schemes such as QPSK (Quadrature Phase Shift Keying) in WCDMA (Wideband Code-Division Multiple Access) and QAM (Quadrature Amplitude Modulation) in OFDM (Orthogonal Frequency Division Multiplex) in the case of limited bandwidth. The information in these schemes is carried by both amplitude and phase of the RF signal. However, intermodulation distortion is a common problem that results from high-efficiency amplification when power amplifiers are operated close to the saturation region. Spectral regrowth causes both the adjacent channel interference and the degradation of the signal-to-noise ratio. Since there is a stringent requirement on spectrum emission, the output power of the amplifier is commonly backed-off so that the amplifier is operated within the linear region, but this normally results in low-efficiency as most DC power is then dissipated in the form of heat. Power amplifiers are critical components which dominate the power consumption of portable devices during transmission. Therefore, linearity as well as efficiency are highly desirable objectives of power amplifier designs.

In view of these problems various wideband linearization techniques have been explored, in particular feedforward, baseband/second harmonic injection and distortion compensation, which are the three major wideband linearization techniques. Feedforward linearization technique provides an excellent suppression of spectral regrowth over broadband operations, but it requires expensive, bulky and complex circuitry. Baseband/second harmonic injection performs a significant cancellation of the odd-order intermodulation products for a wide frequency range operation. Unfortunately, the improvement is sensitive to the magnitude and the phase of the injected signals, so a complicated control circuitry is implied to guarantee a constant improvement over all the dynamic range of the operating power.

Distortion compensation is a highly cost effective linearization technique and may take both digital and analogue forms. Digital signal processing can provide a precise pre-distortion fitting using accurate look-up tables and high-speed calculations, however it is unusual in handset applications because it requires a large occupation of space on the printed circuit board and also implies additional power consumption. More common in handsets is the use of diode distorters which distort the signal before or after the amplifier. These have the advantages of low cost, simple circuitry and low power consumption. However, the nonlinear characteristic matching between the diode distorter and the power amplifier, as well as the unwanted changes on impedance matching, limit the use of such distorters to specific applications.

SUMMARY OF THE INVENTION

According to the present invention there is provided a power amplifier comprising an amplifying bipolar transistor and a self-adaptive bias network situated between an RF input and the base of the amplifying transistor, wherein the self-adaptive bias network suppresses the low frequency even-order intermodulation components.

In preferred embodiments of the present invention the self-adaptive bias network stabilizes a DC bias voltage to provide a substantially constant base-emitter voltage $V_{BE}$.

In preferred embodiments of the present invention the self-adaptive bias network provides an increased DC bias base current self-adaptively with increased input power when the power amplifier is operating within the nonlinear region.

In a preferred embodiment the self-adaptive bias network comprises a low-pass component, a high-pass component, a forward-biased diode and a current-limited resistor connected between a node located between the RF input and the base of the amplifying transistor and ground. The low-pass component, the forward-biased diode and the current-limited resistor are connected in series between the node and ground, and the high-pass component is connected between ground and a node located between the low-pass component and the diode. The diode preferably has a forward bias voltage equal to or lower than the DC bias base-emitter voltage $V_{BE}$ of the amplifying transistor.

In a preferred embodiment, the amplifying transistor is a bipolar transistor, which may be any form of bipolar transistor, for example, a bipolar junction transistor (BJT), a heterojunction bipolar transistor (HBT) or a bipolar complementary metal oxide semiconductor (BiCMOS).

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
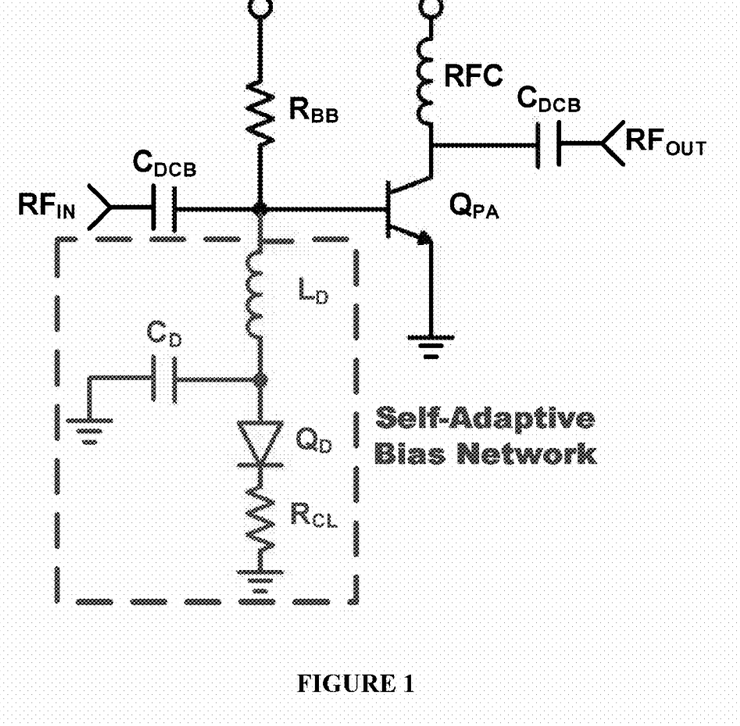
FIG. 1 shows a circuit diagram of one example of the invention.

Referring firstly to FIG. 1 there is shown a circuit diagram of one example of the present invention. In this embodiment the self-adaptive bias network is provided between the input signal path $RF_{IN}$ and ground, in particular at the node connecting the input port of the signal path and the base junction of the amplifying transistor $Q_{PA}$ of power amplifier. In this embodiment the self-adaptive bias network comprises an RF choking inductor $L_D$, a decoupling capacitor $C_D$, a forward-biased diode $Q_D$ and a current-limited resistor $R_{CL}$. The inductor should have a high inductance or a reactance that is higher than 250Ω at the carrier frequency or the lowest operating frequency for wideband operations. The decoupling capacitor should have a high capacitance or a reactance lower than 10Ω for the highest frequency of baseband signal. The forward-biased diode has a forward bias voltage equal to or lower than the DC bias base-emitter voltage $V_{BE}$ of the amplifying transistor of the power amplifier. The current-limited resistor has a resistance of between 10 s and 100 s of Ohms, provides optimized adaptive power management and controls the power consumption of the self-adaptive bias network.

To complete the review of the components in FIG. 1, $V_{BB}$ is the DC supply voltage for both the self-adaptive bias network and the power amplifier, $R_{BB}$ is the resistor biasing the power amplifier, and $C_{DCB}$ is a DC-blocking capacitor that prevents DC signal passing through the input port of the RF signal.

Three goals of the invention that are achieved by the circuit of preferred embodiments are: (a) reduction of baseband distortion, (b) stabilization of DC bias base-emitter voltage, and (c) self-adaptive biasing of DC bias base current.

Reduction of baseband distortion is important to suppress the spectral regrowth (adjacent channel power) by reducing the low frequency even-order intermodulation components.

Source and load impedances are highly significant for both linearity and efficiency of power amplifier designs. In addition to impedance matching for the operating frequency, the terminations of baseband and second harmonic play important roles on elimination of intermodulation distortion. The adjacent channel interference caused by the odd-order products, the even-order terms, which are beyond the signal bandwidth, also affects the linearity of power amplifiers. Spectral regrowth is usually enhanced by the interaction between the fundamental signals and the intermodulated even-order components since those products are with frequencies close to the signal bandwidth. Moreover, imbalanced amplification and phase distortion are mainly caused by the presence of even-order components since the output spectra are equal to the vector sum of the amplified signal and the interacted products.

The self-adaptive bias network of the embodiment of FIG. 1 linearizes the power amplifier by suppressing the low frequency even-order intermodulation components, or named baseband distortion, that are otherwise generated at the input of the power amplifier. The self-adaptive bias network at least of the preferred embodiments provides a low impedance return path for the baseband distortion signals which pass through the inductor $L_D$ and capacitor $C_D$ to ground. As a result, imbalanced amplification, phase distortion, and spectral regrowth of the power amplifier are all reduced by minimizing the interaction between the fundamental input signal and baseband distortion signals.

The above methodology is a wideband linearization technique as it mainly works on the portion of low frequency distortion components, however, it is effective for low current bias conditions. More generally, it is only suitable for the small-signal amplifier designs. Therefore, the self-adaptive bias network performs a dynamic current biasing which increases the bias current for handling the higher output power in bipolar power amplifier designs as will be described further below.

DC bias base-emitter voltage $V_{BE}$ stabilization compensates for the effect of nonlinear transconductance $g_m$ of the amplifying transistor by providing a substantially constant DC bias base-emitter voltage $V_{BE}$.

Figure 2:
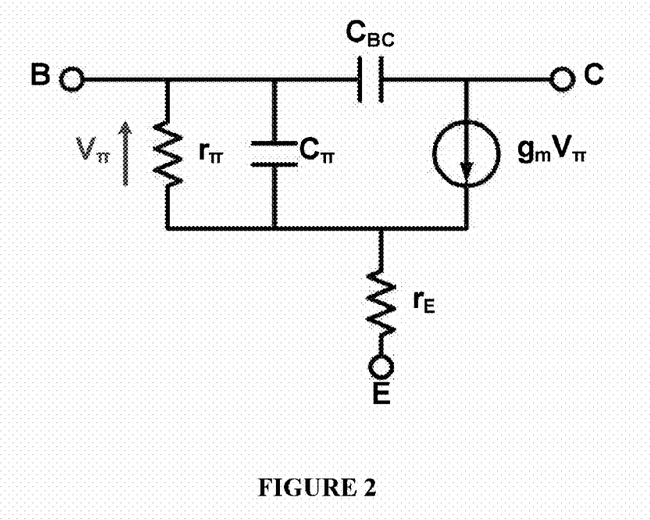
FIG. 2 shows a circuit diagram of a simplified Gummel-Poon model of a normal bipolar transistor.

In a bipolar power amplifier, AM-AM (Amplitude Modulation to Amplitude Modulation) and AM-PM (Amplitude Modulation to Phase Modulation) distortions are mainly caused by two nonlinear components: transconductance $g_m$ and base-collector capacitance $C_{BC}$ in the simplified Gummel-Poon model of a normal bipolar transistor depicted in FIG. 2. Gain is compressed by the decrease of transconductance $g_m$ and phase is distorted by the variation of the base-collector capacitance $C_{BC}$ when a bipolar transistor operates over its load line under large input power.

Figure 3:
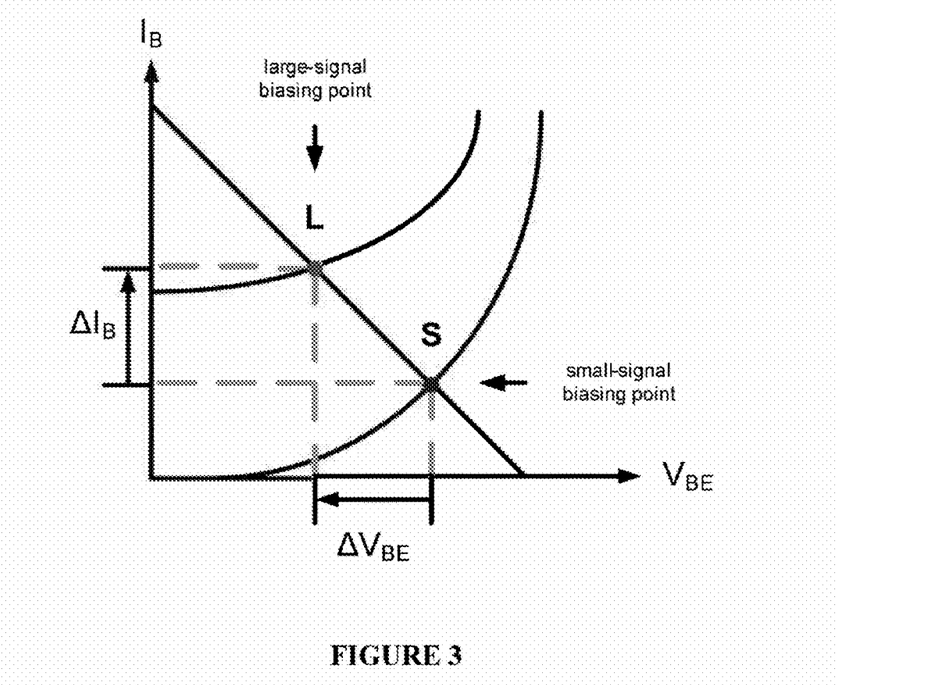
FIG. 3 is a graph of the movement of a biasing point from small-signal to large-signal amplification.
Figure 4:
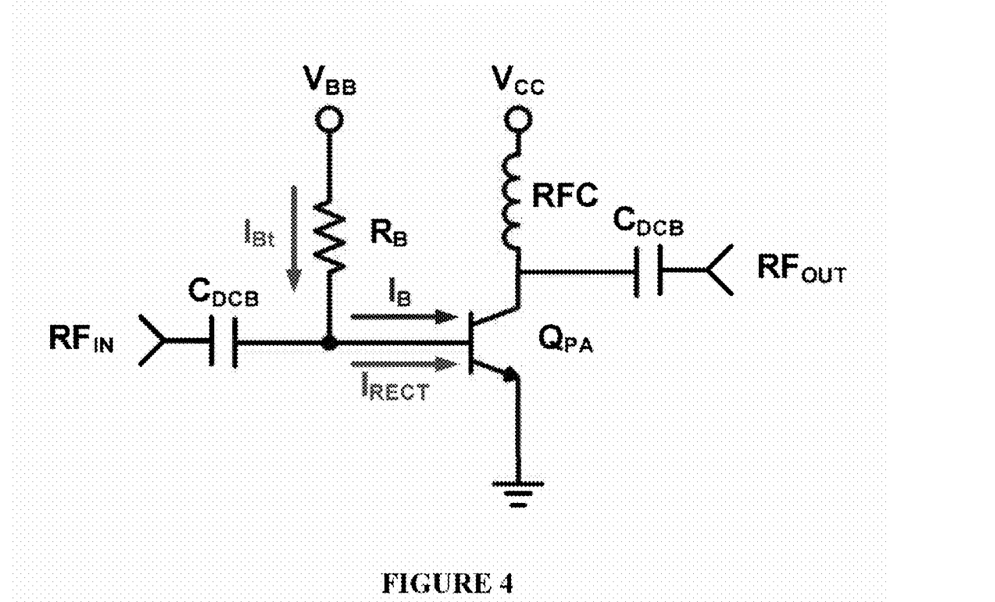
FIG. 4 shows the influence of the rectified current on DC bias base-emitter voltage and base current.

Illustrated in FIG. 3, the I-V characteristic curve of the base-emitter junction diode shows the movement of the DC quiescent point (the biasing point) from small-signal to large-signal amplification. It can be seen that there are delta variations of both DC bias base-emitter voltage $V_{BE}$ and base current $I_B$ from point S to point L, which means that the biasing condition is changed from the linear to nonlinear region. The main reason is that the rectified DC current $I_{RECT}$ illustrated in FIG. 4 increases with an increase in input power. As a result, the total DC biasing base current $I_{BT}$ is equal to the sum of the base current $I_B$ and the rectified current $I_{RECT}$. The base-emitter voltage $V_{BE}$ is then decreased due to the presence of the base bias resistor $R_{BB}$.

Figure 5:
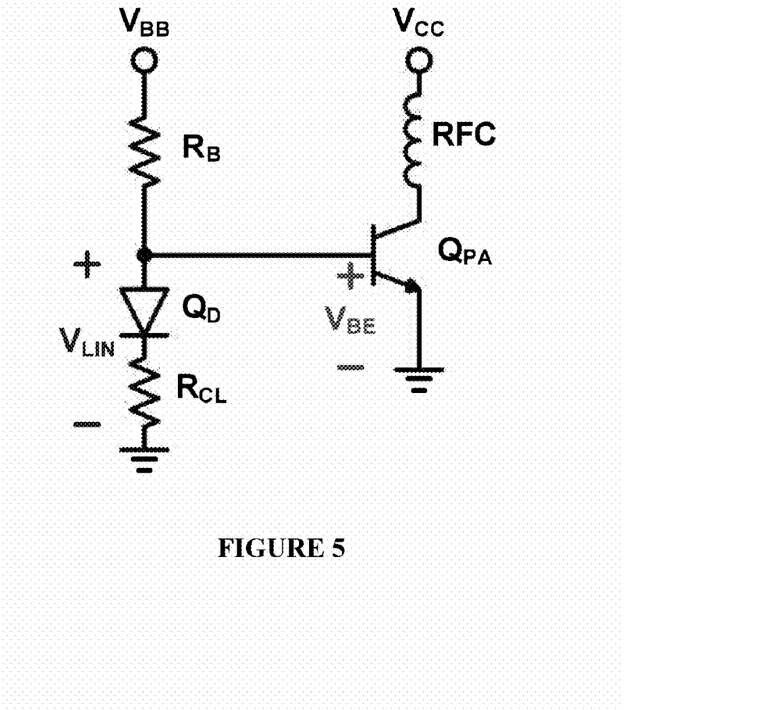
FIG. 5 shows a DC equivalent circuit illustrating the stabilization of the base-emitter voltage.

The self-adaptive bias network of embodiments of the present invention provides a technique to stabilize the DC bias base-emitter voltage $V_{BE}$ to improve the linearity of the amplifier. FIG. 5 shows a DC equivalent circuit for the embodiment of FIG. 1 providing base-emitter voltage $V_{BE}$ stabilization in the bipolar transistor $Q_{PA}$ of the power amplifier. From FIG. 5 it can be seen that in the embodiment of the invention the base-emitter voltage $V_{BE}$ is stabilized because it is forced to be biased with the same DC voltage $V_{SAB}$ at the node connected to the self-adaptive bias network, where $V_{SAB}$ is the sum of the forward bias voltage $V_D$ of the diode $Q_D$ and the voltage drop $V_{RCL}$ across resistor $R_{CL}$. As the diode $Q_D$ is well-isolated from the signal path, its forward bias voltage $V_D$ is not significantly affected by the input signals. Moreover, the extra current provided by the presence of the rectified current $I_{RECT}$ is supplied from the self-adaptive bias network, or more generally less current passes through the self-adaptive bias network. Therefore, $V_{SAB}$ is kept substantially constant. The base-emitter voltage $V_{BE}$ is no longer affected by the presence of the base bias resistor $R_{BB}$, and thus the DC base-emitter voltage $V_{BE}$ is then stabilized. It is known that gain compression (AM-AM distortion) is caused by the decrease of nonlinear transconductance $g_m$ when the operation of the power amplifier is near the saturation region and therefore by stabilizing base-emitter voltage $V_{BE}$ the distortion caused by the nonlinear transconductance $g_m$ can be compensated for as it is approximately a function of base-emitter voltage $V_{BE}$.

Figure 6:
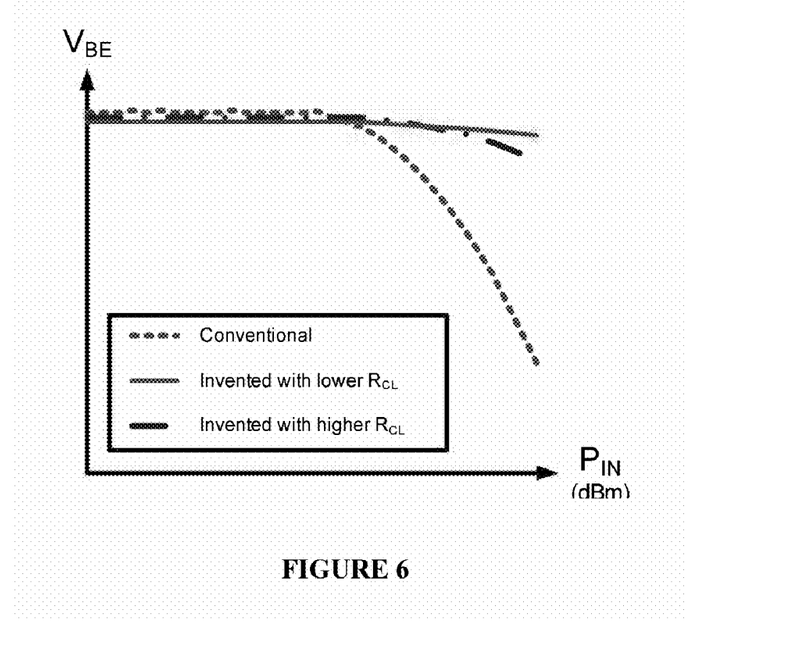
FIG. 6 is a graph comparing DC bias base-emitter voltage between the conventional power amplifier design and invented design.

Since the current pass through the self-adaptive bias network is decreased with the increase of the rectified current $I_{RECT}$, the voltage drop across the current-limited resistor $R_{CL}$ directly affects the DC bias base-emitter voltage $V_{BE}$. It is obvious that the current passing through the self-adaptive bias network is inversely proportional to the resistance of the current-limited resistor $R_{CL}$. FIG. 6 shows the comparison of the base-emitter voltage $V_{BE}$ between the conventional and the invented designs. The lower resistance of the current-limited resistor $R_{CL}$ provides a more stable base-emitter voltage $V_{BE}$ as the current supplied from the self-adaptive bias network for compensating the rectified current $I_{RECT}$ is negligible. Moreover, the internal resistance of the base-emitter junction is slightly affected by the resistance of the current-limited resistor $R_{CL}$. FIG. 6 also shows the base-emitter voltage $V_{BE}$ of the invented design is slightly lower than the conventional one.

A self-adaptive DC bias base current $I_B$ enhances the efficiency and functions as an adaptive power management system by changing the DC bias current self-adaptively with different input power. Since the linearization technique in the embodiments of the invention is effective in particular for small-signal amplifier designs, therefore, a self-adaptive bias network is used to realize the technique in bipolar power amplifier designs.

Figure 7:
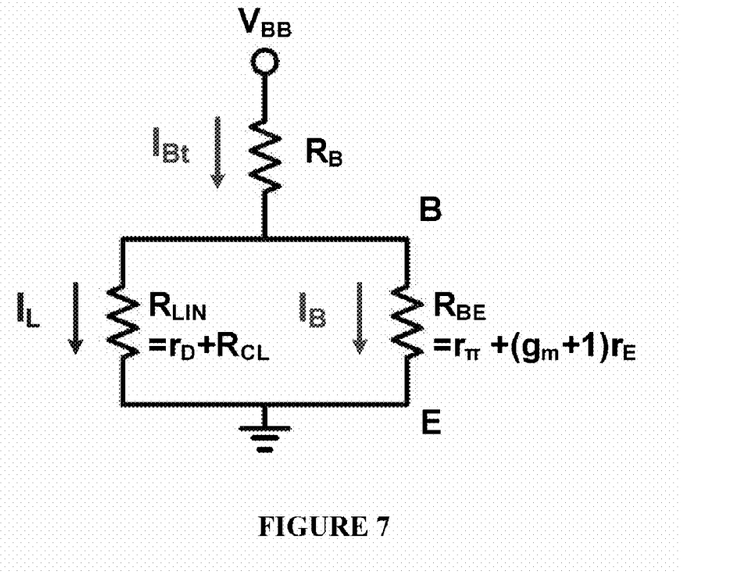
FIG. 7 shows a DC equivalent circuit illustrating the provision of an adaptive base current.

The self-adaptive bias network of embodiments of the invention provides a technique to increase the DC base current $I_B$ self-adaptively for supplying higher DC bias power to handle higher output power during large-signal amplification. To analyze the principle of the self-adaptive bias network, the bipolar transistor is first modeled as the simplified Gummel-Poon model in FIG. 2. The base-emitter resistance $R_{BE}$ of the bipolar transistor is a function of $r_\pi$, $g_m$ and $r_E$. Therefore, an embodiment of the present invention can be simplified to the DC equivalent circuit in FIG. 7. The combination of the total resistance of the self-adaptive bias network $R_{SAB}$ and the base-emitter resistance $R_{BE}$ of the bipolar transistor is a current divider, which means two resistors connected in parallel. It is well-known that $g_m$ and $r_\pi$ decrease nonlinearly, and hence, $R_{BE}$ also decreases. As a result, more current will pass through the base-emitter junction. On the other hand, the presence of the rectified current $I_{RECT}$ shown in FIG. 4 also contributes to the increase of base current $I_B$. It is true that a higher current is rectified with an increase in input power. Therefore, in this embodiment the DC base current $I_B$ may be considered to be self-adaptive because a higher DC base current $I_B$ and thus a higher DC collector current $I_C$ are provided in the event of higher input power. A higher DC bias power is supplied to the power amplifier for large-signal amplification when the transistor operates in the non-linear region. The efficiency of the power amplifier is improved by the concept of adaptive power management in that lower DC bias power is supplied for lower output power while the bias power is self-adaptively increased for a higher output power.

Figure 8:
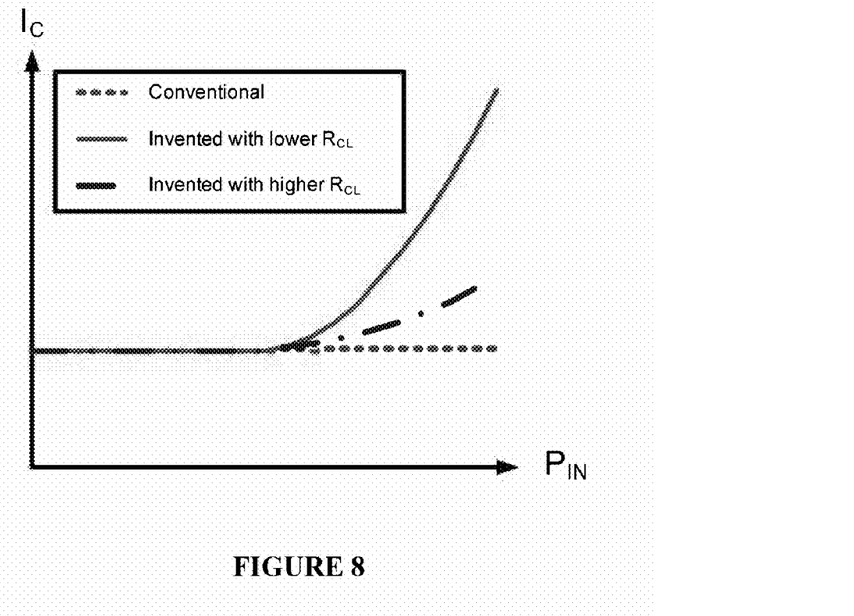
FIG. 8 is a graph comparing DC bias collector current between the conventional power amplifier design and invented design.

Since an additional current is supplied from self-adaptive bias network to compensate for the influence of the rectified current $I_{RECT}$, the forward-biased diode $Q_D$ can be regarded as a current source. The current-limited resistor $R_{CL}$ is also to control the dynamic range of the self-adaptive DC base current $I_B$ and collector current $I_C$ as its resistance directly affects the current passing through the self-adaptive bias network. FIG. 8 shows the comparison of the collector current $I_C$ between the conventional and the invented designs. It shows the collector current $I_C$ of the invented design increases self-adaptively while that of conventional design keeps substantially constant. The total DC biasing base current $I_{BT}$ is equal to the sum of the current passing through the self-adaptive bias network $I_{SAB}$ and the base current $I_B$. A lower resistance of the current-limited resistor $R_{CL}$ provides a greater increase of the base current $I_B$ during the nonlinear drop of the base-emitter resistance $R_{BE}$. Therefore, the dynamic range of self-adaptive collector current $I_C$ is increased with smaller resistance of the current-limited resistor $R_{CL}$.

It will be understood by those skilled in the art that the main functions of $R_{CL}$ are to decide the stability of base-emitter voltage $V_{BE}$, to control the dynamic range of the adaptive base current $I_B$ or collector current $I_C$, and to limit the current $I_{SAB}$ passing through the self-adaptive bias network as the DC power consumption of the self-adaptive bias network $P_{SAB}=I_{SAB}V_{BE}$. While the operating principle of the self-adaptive biasing technique adopts the nonlinearity of the normal bipolar transistor, the present invention can be applied to every type of bipolar transistor such as bipolar junction transistors (BJT), heterojunction bipolar transistors (HBT) and bipolar complementary metal oxide semiconductor (BiCMOS) transistors.

At least in preferred embodiments, the present invention has the following advantages: the self-adaptive bias network suppresses the spectral regrowth of the power amplifier on the portion of low frequency distortion components, which means that the self-adaptive bias network operates independently of the carrier frequency; the self-adaptive bias network improves the linearity by reducing the influence of the nonlinear transconductance $g_m$ by stabilizing the DC bias base-emitter voltage $V_{BE}$; the power amplifier topology improves the efficiency by self-adaptive biasing; lower DC power is consumed for lower output power with the amplifier operating in the linear region, and higher DC power is consumed for higher output power with the amplifier operating in the non-linear region; the self-adaptive bias network reduces the DC bias power of the amplifier for small-signal amplification and improves the output power handling of the amplifier (i.e., higher DC bias power) for large-signal amplification; the self-adaptive current utilizes the nonlinearity of a conventional bipolar transistor; and the diode $Q_D$ is well-isolated from the RF signals, which means that the diode $Q_D$ is not necessarily a microwave diode.

Figure 9:
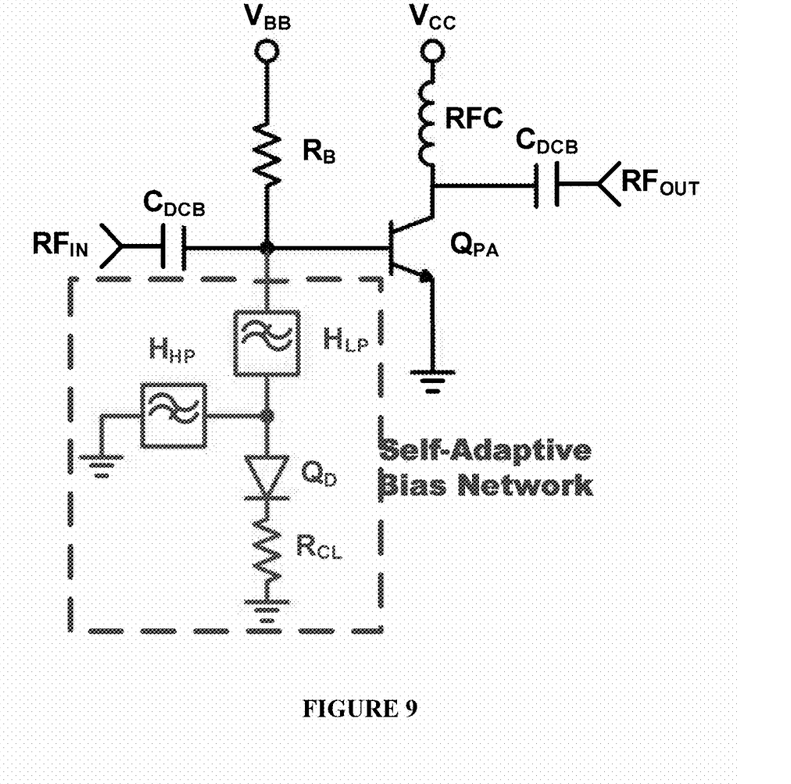
FIG. 9 shows a schematic diagram of one example of a general form of the invention.

The circuit of FIG. 1 is just one possible example of an embodiment of the invention, and FIG. 9 shows a more generalized circuit diagram in which $L_D$ and $C_D$ are generalized to low-pass $H_{LP}$ and high-pass $H_{HP}$ components which may take various forms. For example, $H_{LP}$ may comprise an RF choke inductor L as in FIG. 1, or may comprise a low pass filter. $H_{LP}$ may be any suitable component chosen to provide a path for DC current flow to the diode, isolate fundamental RF signals, and bypass the low-frequency even-order intermodulation components. $H_{HP}$ may be a decoupling capacitor as in FIG. 1, or may be a high pass filter. $H_{HP}$ is chosen to isolate the DC, decouple the leakage of the fundamental RF signals, and bypass the low-frequency even-order intermodulation components to ground.

As an example of the advantages provided by the present invention, at least in its preferred forms, reference will now be made to FIGS. 10 to 13 and the following case study of an Infineon RF bipolar transistor BFP450 Class A power amplifier design which is used to demonstrate how the DC bias base-emitter voltage $V_{BE}$, collector current $I_C$ and the adaptive power management function with varying the resistance of the current-limited resistor $R_{CL}$. The amplifiers are under two-tone test with 1 MHz tone spacing centered at 2.45 GHz. A conventional design (PA_ref) is biased with 3V and 50 mA which aims at providing a maximum output current swing. Examples according to embodiments of the invention are connected with 10 ohms (SAB_10), with 100 ohms (SAB_100) and with 1 k ohms (SAB_1 k) current-limited resistor $R_{CL}$ are all biased with 3V and a self-adaptive current.

Figure 10:
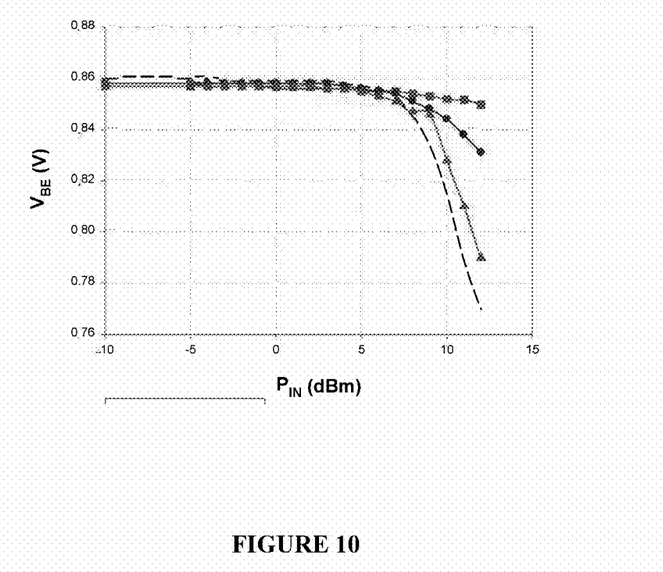
FIG. 10 shows the effect of varying the current-limited resistance on DC bias base-emitter voltage of BFP450 power amplifier design in an example of the invention as a comparison with the prior art.

As discussed before, the nonlinear drop of the DC bias base-emitter voltage $V_{BE}$ mainly results from the influence of the rectified current $I_{RECT}$. Depicted in FIG. 10, the base-emitter voltage $V_{BE}$ of PA_ref shows a good agreement with the analysis. The rectified current $I_{RECT}$ is increased with the increase of input power $P_{IN}$, and hence, the base-emitter voltage $V_{BE}$ is decreased from 0.86V to 0.77V. For embodiments of the invention, the rectified current $I_{RECT}$ is supplied from the self-adaptive bias network, therefore, the total base current $I_{BT}$ remains unchanged and the base-emitter voltage $V_{BE}$ is kept substantially constant. FIG. 10 also shows the effect of varying the current-limited resistance $R_{CL}$ on base-emitter voltage $V_{BE}$ in embodiments of the invention, and it can be seen that the base-emitter voltage $V_{BE}$ is more stable with a smaller resistance connected (i.e. $V_{BE}$ are only decreased to 0.85V, 0.83V and 0.79V of SAB_10, SAB_100 and SAB_1 k respectively). Moreover, the trend of the base-emitter voltage $V_{BE}$ of SAB_1 k shows that if the current-limited resistance $R_{CL}$ is too large, the self-adaptive bias network will have no effect on the base-emitter voltage $V_{BE}$ stabilization as the current passing through the self-adaptive bias network $I_{SAB}$ is not enough to compensate the rectified current $I_{RECT}$ and keep the potential difference of the self-adaptive bias network substantially constant (i.e. $V_{SAB}=V_D+I_{SAB}R_{CL}$).

Figure 11:
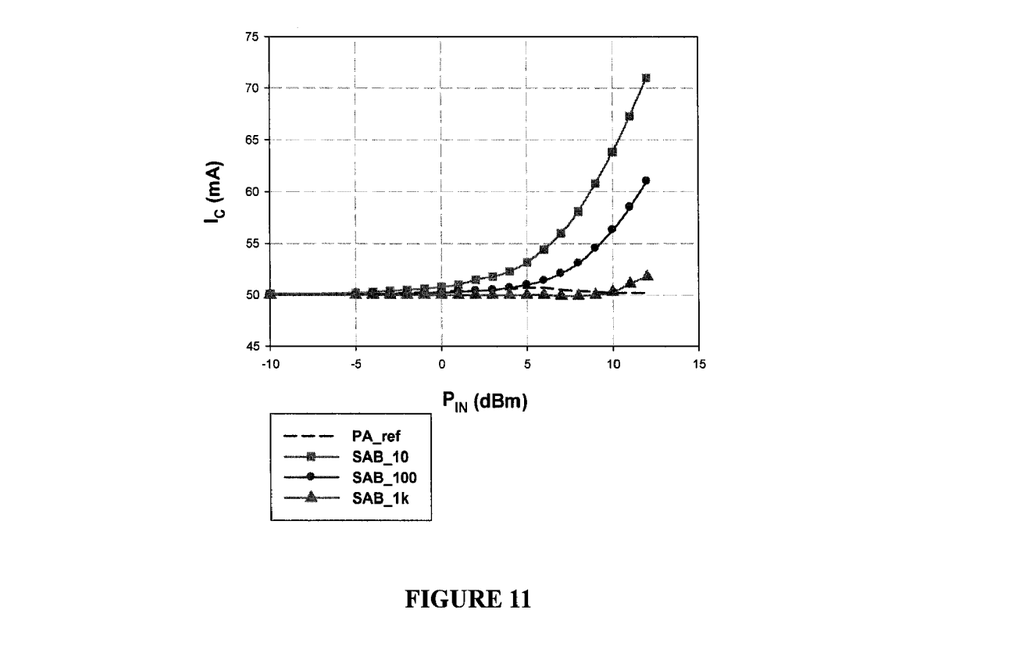
FIG. 11 shows the effect of varying the current-limited resistance on DC bias collector current of BFP450 power amplifier design in an example of the invention as a comparison with the prior art.

FIG. 11 illustrates that the DC collector current ($I_C$) of the conventional design is nearly constant while that of embodiments of the invention increases with the increase of input power ($P_{IN}$). The collector current ($I_C$) of the embodiments of the invention increases self-adaptively because of the influence of the rectified current $I_{RECT}$ and the nonlinear decrease of the base-emitter resistance $R_{BE}$. Since the base current $I_B$ is increased with the presence of the rectified current $I_{RECT}$, the collector current $I_C$ is then increased directly proportional to the base current $I_B$ Moreover, FIG. 11 also shows that the dynamic range of self-adaptive collector current $I_C$ is different with varying current-limited resistance $R_{CL}$. This shows a good agreement with the reason of the nonlinear drop of base-emitter resistance $R_{BE}$. As discussed before, the combination of the total resistance of the self-adaptive bias network and the base-emitter resistance $R_{BE}$ is simply a current divider, therefore, the base current $I_B$ is increased significantly with a smaller current-limited resistance $R_{CL}$. Moreover, the trend of the collector current $I_C$ of SAB_1 k shows that if the current-limited resistance $R_{CL}$ is too large, the self-adaptive bias network will have no effect on the self-adaptive current as the current pass through the self-adaptive bias network $I_{SAB}$ is not enough to compensate the rectified current $I_{RECT}$.

Figure 12:
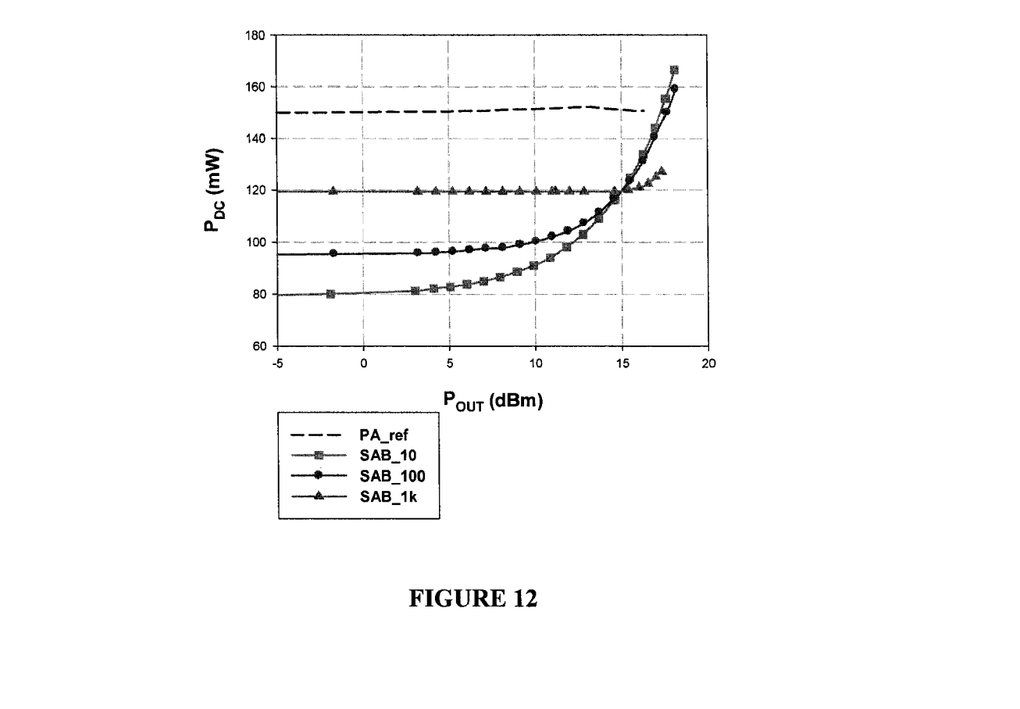
FIG. 12 shows the effect of varying the current-limited resistance on DC bias power of the amplifying transistor of BFP450 power amplifier design in an example of the invention as a comparison with the prior art.
Figure 13:
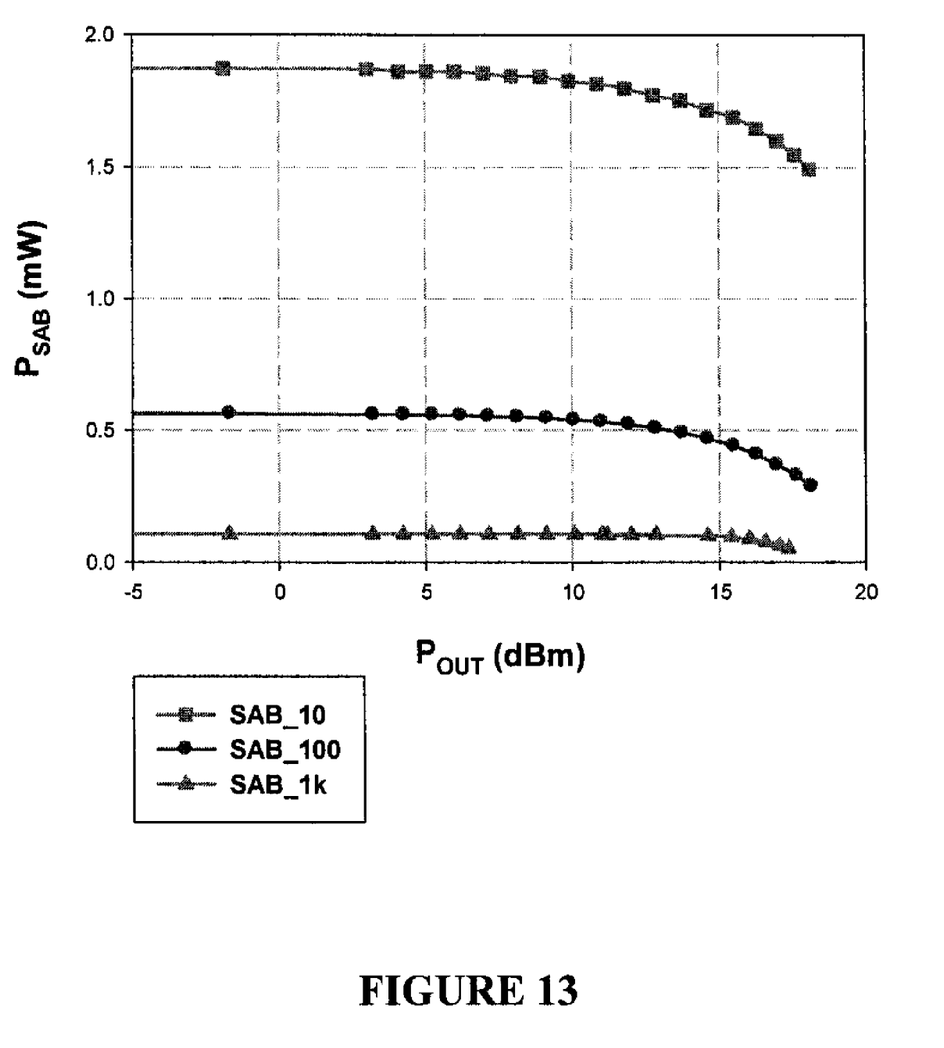
FIG. 13 shows the effect of varying the current-limited resistance on DC power consumption of the self-adaptive bias network of BFP450 power amplifier design in an example of the invention as a comparison with the prior art.

To demonstrate the effect of adaptive power management, the bias current of embodiments of the invention is first optimized at the 1 dB gain compression of the conventional design ($I_C$=40 mA). FIG. 12 shows the DC bias power of the amplifying transistor ($P_{DC}$) as a function of the output power ($P_{OUT}$). The DC bias power $P_{DC}$ of PA_ref is about 150 mW, while those of SAB_10, SAB_100 and SAB_1 k are first kept substantially constant and then increased for a higher output power. Although the DC bias power $P_{DC}$ Of SAB_10 and SAB_100 is higher than that of PA_ref, the output powers are also higher than the saturated power (16 dBm) of PA_ref. With varying the current-limited resistance, only 80 mW, 95 mW and 120 mW are biased for SAB_10, SAB_100 and SAB_1 k respectively during small-signal amplification ($P_{OUT}$ is lower than 5 dBm). On the other hand, FIG. 13 shows the DC power consumption of the self-adaptive bias network ($P_{SAB}$) as a function of the fundamental output power ($P_{OUT}$). The self-adaptive bias network only consume less than 1.9 mW, 0.6 mW and 0.1 mW for SAB_10, SAB_100 and SAB_1 k designs respectively.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A power amplifier, comprising:
an amplifying transistor including a base, wherein said amplifying transistor comprises a bipolar transistor; and
a self-adaptive bias network situated between an RF input and the base of said amplifying transistor, wherein said self-adaptive bias network suppresses low frequency even-order intermodulation components, wherein said self-adaptive bias network stabilizes a DC bias voltage to provide a substantially constant baseemitter voltage for the amplifying transistor, and wherein said self-adaptive bias network comprises a low-pass component, a high-pass component, a forward-biased diode and a current-limited resistor coupled between ground and a node located between said RF input and said base of the amplifying transistor.

2. A power amplifier as claimed in claim 1, wherein said self-adaptive bias network provides an increased DC base current with increased input power when the power amplifier is operating within the nonlinear region.

3. A power amplifier as claimed in claim 1, wherein said low-pass component, said forward-biased diode and said current-limited resistor are coupled in series between said node and ground, and said high-pass component is coupled between ground and a node located between said low-pass component and said diode.

4. A power amplifier as claimed in claim 3, wherein said diode has a forward bias voltage equal to or lower than a DC bias base-emitter voltage of the amplifying transistor.

5. A power amplifier, comprising:
an amplifying transistor including a base; and
a self-adaptive bias network situated between an RF input and the base of said amplifying transistor, wherein said self-adaptive bias network suppresses low frequency even-order intermodulation components, wherein said self-adaptive bias network stabilizes a DC bias voltage to provide a substantially constant baseemitter voltage for the amplifying transistor, and wherein said self-adaptive bias network comprises a low-pass component, a high-pass component, a forward-biased diode and a current-limited resistor coupled between ground and a node located between said RF input and said base of the amplifying transistor.

6. A power amplifier as claimed in claim 5, wherein said self-adaptive bias network provides an increased DC base current with increased input power when the power amplifier is operating within the nonlinear region.

7. A power amplifier as claimed in claim 5, wherein said low-pass component, said forward-biased diode and said current-limited resistor are coupled in series between said node and ground, and said high-pass component is coupled between ground and a node located between said low-pass component and said diode.

8. A power amplifier as claimed in claim 7, wherein said diode has a forward bias voltage equal to or lower than a DC bias base-emitter voltage of the amplifying transistor.

* * * * *

UNITED STATES PATENT AND TRADEMARK OFFICE
CERTIFICATE OF CORRECTION

PATENT NO. : 7,893,771 B2
APPLICATION NO. : 11/620290
DATED : February 22, 2011
INVENTOR(S) : Kwok Wai Lau and Quan Xue It is certified that error appears in the above-identified patent and that said Letters Patent is hereby corrected as shown below:

In the Claims

Column 8, line 15 replace "baseemitter" with "base-emitter"

Column 8, line 43 replace "baseemitter" with "base-emitter"

Signed and Sealed this
Twenty-fifth Day of June, 2013

Teresa Stanek Rea
*Acting Director of the United States Patent and Trademark Office*